United States Patent [19]

Nishizawa et al.

[11] Patent Number: 5,230,927
[45] Date of Patent: Jul. 27, 1993

[54] METHOD FOR METAL-PLATING RESIN MOLDED ARTICLES AND METAL-PLATED RESIN MOLDED ARTICLES

[75] Inventors: Chiharu Nishizawa, Matsudo; Takahiro Seki; Michio Oba, both of Tokyo; Yukiya Nakazato, Matsudo, all of Japan

[73] Assignee: Mitsubishi Gas Chemical Company, Inc., Tokyo, Japan

[21] Appl. No.: 740,852

[22] Filed: Jul. 31, 1991

Related U.S. Application Data

[63] Continuation of Ser. No. 477,763, Feb. 9, 1990, abandoned.

[30] Foreign Application Priority Data

Feb. 16, 1989 [JP] Japan ................................. 1-35018

[51] Int. Cl.$^5$ ............................................. C23C 26/00
[52] U.S. Cl. ................................. 427/306; 427/305; 427/443.1
[58] Field of Search ............... 427/304, 305, 306, 438, 427/443.1

[56] References Cited

U.S. PATENT DOCUMENTS

| | | | |
|---|---|---|---|
| 3,937,857 | 2/1976 | Brummett | 427/306 |
| 4,035,227 | 7/1977 | Doty | 427/306 |
| 4,042,729 | 8/1977 | Polichette | 427/304 |
| 4,059,710 | 11/1977 | Nishiyama | 427/304 |
| 4,084,968 | 4/1978 | Janssen | 427/304 |
| 4,486,463 | 12/1984 | Rubner | 427/304 |
| 4,495,253 | 1/1985 | Abel | 427/304 |
| 4,499,157 | 2/1985 | Mulliner | 427/304 |
| 4,532,015 | 7/1985 | Boultinghouse | 427/306 |
| 4,670,306 | 6/1987 | Salem | 427/306 |
| 4,795,671 | 1/1989 | Shiiki et al. | 427/96 |
| 4,812,275 | 3/1989 | Yumoto | 427/306 |
| 4,812,353 | 3/1989 | Yumoto | 427/96 |
| 5,015,519 | 5/1991 | Yumoto | 427/96 |

FOREIGN PATENT DOCUMENTS 898075 4/1972 Canada ............................. 427/304

OTHER PUBLICATIONS

Patent Abstracts of Japan, vol. 12, No. 219 (C-506)[3066], Jun. 22, 1988; & JP-A-63 14 880 (Dianippon Ink. & Chem. Inc.) Jan. 22, 1988.
Patent Abstracts of Japan, vol. 11, No. 371 (C-462)[2818], Dec. 3, 1987; & JP-A-62 142 786 (Toyo Soda Mfg) Jun. 26, 1987.

Primary Examiner—Shrive Beck
Assistant Examiner—Vi Duong Dang
Attorney, Agent, or Firm—Wenderoth, Lind & Ponack

[57] ABSTRACT

A process for metal plating a resin molded article molded from a resin composition containing as main components, a polyphenylene sulfide resin and a glass-reinforcing agent, which comprises, before the metal plating, (1) treating the resin molded article by immersion in a mixed liquid of nitric acid and a fluoride salt or in a mixed liquid of nitric acid and hydrofluoric acid (A treatment), then treating the resulting resin molded article by immersion in an organic polar solvent-containing liquid (B treatment), and further, if necessary, treating the resulting resin molded article by immersion in an aqueous floride salt or hydrofluoric acid solution (C treatment).

5 Claims, 1 Drawing Sheet

METHOD FOR METAL-PLATING RESIN MOLDED ARTICLES AND METAL-PLATED RESIN MOLDED ARTICLES

This application is a continuation of now abandoned application, Ser. No. 07/477,763 filed on Feb. 9, 1990 now abandoned.

BACKGROUND OF THE INVENTION

1. Field of the Invention

The present invention relates to a process for metal-plating a resin molded article formed from a resin composition containing as main components a polyphenylene sulfide and a glass-reinforcing agent(filler), particularly to a process of pretreatment of metal-plating. More detailedly, the invention relates to a process which comprises pretreating the above resin molded article and then metal-plating the resultant resin molded article to obtain a resin molded article having a strong peel strength of the metal plated layer as well as an excellant smoothness of the surface, and to the obtained molded article.

2. Prior Art

Polyphenylene sulfide (hereinafter sometimes abbreviated as "PPS") is known as a resin excellent in heat resistance, solvent resistance, electric characteristics, mechanical strength, dimensional stability, flame retardancy, etc., and has recently received attention. Particularly, this PPS resin can further be improved in the above performances by conjugation with a fibrous reinforcing agent such as glass fiber and carbon fiber or with an inorganic filler such as talc, clay and silica, and the resultant improved resins are widely used as electric parts, electronic parts, mechanical structural parts, etc. On the other hand, based on its excellent solder heat resistance, dielectric characteristic and the like, use development of PPS resin as a material for printed circuit boards, three dimensional molded printed circuit boards has also been progressed. It is considered that metal plating is indispensable for PPS resin molded articles to be utilized for these uses. However, since the PPS resin is excellent in chemicals resistance, it is extremely difficult to chemically etch it and when metal-plating is made, it is difficult to obtain a sufficient peel strength of the metal. Thus, there has been developed and proposed treating liquids for chemically etching, before metal plating, molded articles of PPS resins or reinforced PPS resin compositions. Namely, various processes have been proposed which comprise etching a molded article of a PPS resin or glass reinforcing agent-containing PPS resin for its surface with nitric acid alone, a mixed liquid of nitric acid and hydrofluoric acid, a solution of hydrofluoric acid or a solution of ammonium hydrogenfluoride or a mixed liquid of nitric acid and a fluoride salt, and then metal plating the etched molded article to obtain a plated molded article having an excellent adhesive strength (Japanese Laid-Open Patent Publications Nos. 54290/1984, 63674/1987, 142786/1987 and 14880/1988).

According to these known processes, the present inventors etched a molded article of a glass reinforcing agent particularly glass fiber-containing PPS resin with a mixed liquid of nitric acid and hydrofluoric acid (or its salt) and then metal plated the resulting etched molded article. As a result, it was revealed that a severe treatment is necessary to obtain a sufficient peel strength by this etching and as a result, unevenness of the plated surface becomes extremely large and appearance thereof also becomes bad. When a plated product is used in preparation of a printed circuit board by resist pattern formation, electric plating or the like or a three dimensional molded printed circuit board, it has become a large obstacle and practical problem that unevenness of the plated surface is thus large and surface smoothness is insufficient.

SUMMARY OF THE INVENTION

The present inventors have studied an etching process for obtaining a metal plated product wherein adhesion between the metal and the molded article of a glass reinforcing agent-containing PPS resin is good and which product has excellent surface smoothness. As a result, it has been found that a metal plated product having strong adhesive ability and extremely excellent surface smoothness can be obtained by treating a molded resin article by immersion in a mixed liquid of nitric acid and hydrofluoric acid (or its salt), and then treating the resulting resin article by immersion in an organic polar solvent-containing liquid, and that the thus obtained metal-plated product has fully satisfactory properties a molded article for the above printed circuit boards or three dimensional molded printed circuit boards.

The present invention has been accomplished based on such findings, and relates to a process for metal-plating a resin molded article molded from a resin composition containing as main components a polyphenylene sulfide resin and a glass-reinforcing agent, which comprises, before the metal plating, (1) treating the resin molded article by immersion in a mixed liquid of nitric acid and a fluoride salt or in a mixed liquid of nitric acid and hydrofluoric acid (A treatment), then
(2) treating the resulting resin molded article by immersion in an organic polar solvent-containing liquid (B treatment), and further, if necessary,
(3) treating the resulting resin molded article by immersion in an aqueous floride salt or hydrofluoric acid solution (C treatment).

When a resin molded article molded from a resin composition containing as main components a PPS resin and a glass-reinforcing agent is treated with a mixed liquid of nitric acid and hydrofluoric acid (or a salt thereof), the PPS resin is decomposed by nitric acid and the glass component is made to dissolve therein by hydrofluoric acid (or the salt thereof), whereby the surface layer of the resin molded article was etched.

However, when the resultant resin molded article is then treated with an organic polar solvent-containing liquid, a part of the roughened surface layer of the resin molded article is effectively removed by dissolution to form a surface suitable for obtaining a metal plated product having a surface with sufficiently adhered and is smooth. As a result it has become possible to obtain a molded article having such a surface, according to the invention.

When the A treatment is carried out by using a nitric acid alone, and the B treatment and optionally, the C treatment are performed, the effect similar to aforesaid treatments can be obtained However, the A treatment according to the invention wherein a mixed liquid of nitric acid and hydrofluoric acid (or its salt) is used is preferred because of its high efficiency.

DETAILED DESCRIPTION OF THE INVENTION

Figure 1:
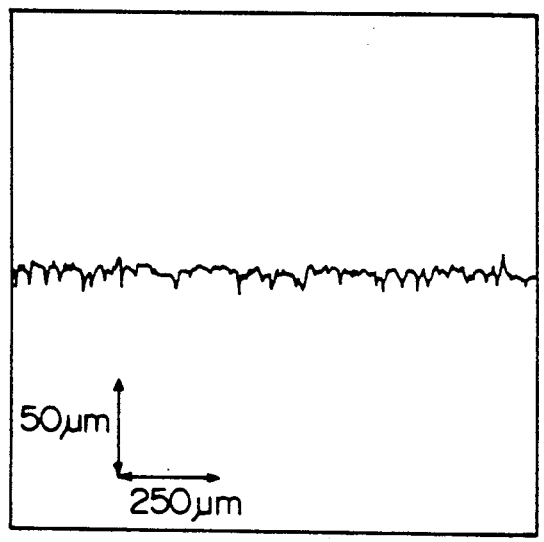
FIG. 1 shows a surface roughness curve of a copper electroplated test piece obtained in Example 1.

Any PPS resin usually referred to as PPS resin can be used in the present invention, but generally suitable is a PPS resin containing the paraphenylene sulfide unit

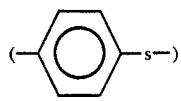

in an amount of at least 70 mole %, preferably at least 90 mole % of all the recurring units. If the paraphenylene sulfide unit in the PPS resin is less than 70 mole %, it is difficult to obtain a composition having excellent properties peculiar to PPS.

Various known processes can be employed as processes of polymerization for preparation of PPS resins used in the invention, but preferred is a process which comprises reacting sodium sulfide with p-dichlorobenzene in an amide solvent such as N-methylpyrrolidone and dimethylacetamide or a sulfone solvent such as sulfolane. It is preferred in the process to add a carboxylate salt of alkali metal such as sodium acetate or lithium acetate in order to adjust the polymerization degree. The PPS resin can contain as copolymerization component(s) meta bonds

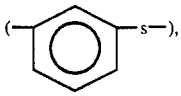

ether bonds

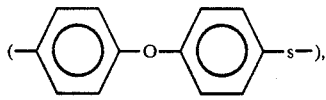

sulfone bonds

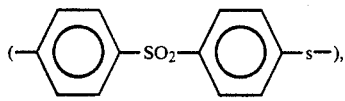

the biphenyl bonds

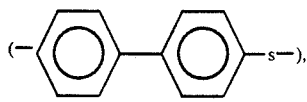

substituted phenyl-sulfide bonds

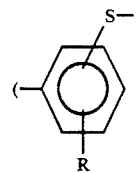

wherein R represents an alkyl, nitro, phenyl or alkoxy group) and the like, in an amount less than 30 mole % and in the range which does not affect bad influence on crystallinity of the resultant polymer, but it is preferred that amount of these copolymerization components is less than 10 mole %.

It is desirable that the PPS resin of the invention has a melt viscosity at 300° C. of about 100 to about 40,000 poise, preferably about 100 to about 20,000 poise.

The resin compositon of the invention is composed mainly of the above PPS resin and a glass-reinforcing agent. As such glass-reinforcing agents, glass fiber is typical, but in addition glass beads, glass powder, quartz fiber, quartz beads, quartz powder and the like can be mentioned. Most preferred among them is glass fiber.

It is desirable in the resin composition of the invention that total amount of the above PPS resin and glass-reinforcing agent is at least 60 %, preferably at least 70 % by weight, of the whole resin composition, and the rate of the PPS resin to the glass-reinforcing agent is in the range of 2:8 to 9:1, preferably 3:7 to 7:3.

Thus the resin composition of the invention can contain other components(s) than the PPS resin and glass-reinforcing agent in an amount less than 40%, preferably less than 30% by weight.

There can be mentioned as these other components resins other than PPS resins and conventional resin additives, and specific examples thereof are described below. There can for example be mentioned as other resins polyphenylene ether, polyethylene terephthalate, polybutylene terephthalate, polyarylate, polyetherimide, polyethersulfone, polysulfone, polyamides, polycarbonates, etc. It is preferred to add these other resins to the system while the system is mixed so that they can be finely dispersed in the PPS resin matrix. Thus these other resins are used in the rate of 50% or less, preferably 40% or less, by weight based on the whole resin components excluding the glass-reinforcing agent. When these other resins are added to the PPS resin matrix in the above-described manner, these other resin components than the PPS resin which disperse on the surface of the resin molded article are suitably eluted and removed by treatment of the invention, and numerous minute pores are formed on the surface, and due to such minute pores adhesion of plating is still further enhanced compared to the case of a molded article of the PPS resin alone.

On the other hand there can be used as resin additives which can be added to the resin composition of the invention various resin additives which can usually be added for improvement of physical properties and use of resins. For example, there can be added in the composition various additives, for example, an inorganic filler such as titanium oxide, calcium carbonate, barium sulfate, potassium titanate, asbestos, carbon fiber, calcium silicate, mica or talc, and in addition a flame retartant, an antioxidant, an ultraviolet radiation absorber and the like.

In the present invention the above-described resin composition is molded according to a process known per se, and the resultant resin molded article is subjected, before metal plating, to the following A treatment and B treatment, and if necessary further to C treatment.

Each of these treatments is described below.

A treatment

The molded resin molded article is first treated by immersion in a mixed liquid of nitric acid and a fluoride salt, or in a mixed liquid of nitric acid and hydrofluoric acid. Desirable composition ratio of these mixed liquids varies depending upon the mixing ratio of the resin componet and the glass-reinforcing agent in the composition used, and is such that nitric acid is contained in an amount of 400 to 800 g and hydrofluoric acid (HF) or its salt is contained in an amount of 50 to 300 g per liter of each of the mixed liquids. Examples of the fluoride salt include ammonium hydrogenfluoride, ammonium fluoride, sodium hydrogenfluoride, sodium fluoride, potassium fluoride, etc., prefered among them is ammonium hydrogenfluoride ($NH_4F \cdot HF$).

Thus it is preferred in A treatment to use a mixed liquid of nitric acid and ammonium hydrogenfluoride. Immersion in this A treatment can be carried out by holding the resin molded article in the above mixed liquid at temperatures in the range of 30° to 60° C., preferably 40° to 55° C., for 3 to 20 minutes, preferably 5 to 15 minutes. The resin molded article after the A treatment is scheduled to be subjected to immersion in the following B treatment, but preferably washed with water before the treatment.

B treatment

The resulting resin molded article is then treated by immersion in an organic polar solvent-containing liquid. Preferred examples of this organic polar solvent include N-methylpyrrolidone and dimethylacetamide. N-methylpyrrolidone is particularly preferred.

The organic polar solvent-containing liquid in this B treatment can either be the above organic polar solvent itself or a mixed liquid of this polar solvent and another medium. In the latter case it is desirable that the rate of the contained organic polar solvent is at least 5%, preferably at least 20% by weight.

Specific examples of the mixed liquid containing organic polar solvents(s) include N-methylpyrrolidone/dimethylacetamide, N-methylpyrrolidone/dimethylformamide, N-methylpyrrolidone/ethanol, N-methylpyrrolidone/water, dimethylacetamide/dimethylformamide, etc.

This B treatment can be carried out by holding the resin molded article after A treatment in the above organic polar solvent-containing liquid at normal temperature, generally at temperatures of 15° to 30° C., for 1 to 10 minutes.

A still further preferred result can be obtained by carrying out the immersion together with ultrasonic treatment.

After B treatment was thus conducted, the resulting resin molded article is washed with water and sent to the next step. Effect of this water washing is still further enhanced by ultrasonic treatment. When whitened deteriorated resin layers are present on the surface of the resin molded article after completion of the above B treatment, B treatment and water washing can again be carried out.

In the present invention, the resin molded article obtained by the above A treatment and B treatment can be subjected to a metal plating treatment to obtain a plated product having an excellant adhesion and a smooth surface.

However, it has been revealed by research of the present inventors that adhesion can further be enhanced by carrying out the following C treatment after the above-described A and B treatments in the invention.

C treatment

The resin molded article after the B treatment can, if necessary, be treated by immersion in an aqueous solution of a fluoride salt or hydrofluoric acid. Example of the fluoride salt include ammonium hydrogen-fluoride, ammonium fluoride, sodium hydrogenfluoride, sodium fluoride and potassium fluoride. Preferred examples of the aqueous soluton used in C treatment are an aqueous hydrofluoric acid solution and an aqueous ammonium hydrogenfluoride solution. It is suitable that the fluoride salt or hydrofluoric acid is contained in an concentration of 5 to 60% in the aqueous solution in this C treatment. Desirable condition of immersion in C treatment is such that the temperature is in the range of normal temperature to 60° C., preferably 30° to 50° C., and the time is in the range of 1 to 20 minutes, preferably 2 to 10 minutes.

After the above C treatment the resin molded article is washed with water and then sent to the plating step.

In the invention the resin molded article is subjected to metal plating treatment after the aforementioned A treatment and B treatment and if necessary, C treatment. The metal-plating treatment can be carried out according to a process known per se, and particularly a known process applied to plating of a molded article of the PPS resin can be utilized as it is. For example, each step of predipping, catalyzing, acceleration and electroless plating is carried out, and then electric plating using a metal can be carried out.

According to the above present invention there can be obtained a plated product which has a high peel strength of the plated part and has smoothness of the surface markedly excellent compared to the smoothness of a plated product by a conventional process. A product obtained by the present invention is fully applicable even to minute circuit patterns, and further, never causes a large trouble in molding of resist patterns or in preparation of printed circuit boards or three dimensional molded printed circuit boards.

In the following examples and comparative examples surface smoothness of the plated resin articles was evaluated by measurement of center line average roughness (Ra).

Measuring methods of this center line average roughness (Ra) are detailedly described in ANSI B 46.1-1979 and in ISO R 468-1966 in USA, and in JIS B 0601-1982 in Japan.

In the invention, surface roughness (Ra) of resin moldings was measured using "surface roughness tester surfcom 554A type" produced by TOKYO SEIMITSU CO., The present invention is further detailedly described by examples and comparative examples.

In this conneciton, "%" in the examples and comparative examples means "% by weight" except for the case that it is otherwise defined.

Example 1

PPS resin pellets containing 40% of glass fiber (produced by Phillips Petroleum Company RYTON R-4) were molded into plates (length 100 mm, width 25 mm, thickness mm) as test pieces by injection molding. Molding condition:

Injection molder: IS-150 EN produced by TOSHIBA MACHINE CO., LTD.
Cylinder temperature: 340° C.
Mold temperature: 120° C.
Injection pressure: 1000 kg/cm The above test pieces were annealed at 120° C. for 2 hours, subjected to degreasing treatment and then subjected to the following pretreatment steps (steps 1 to 4).

Step 1 Etching

The above test pieces were immersed in an etching solution of 100 g of acidic ammonium fluoride in 600 ml of 61 % nitric acid at 50° C. for 10 minutes and then water washed with deionized water for 1 minute.

Step 2 Solvent treatment

After the water washing the resultant test pieces were immersed in N-methyl-2-pyrrolidone for 4 minutes and then subjected to ultrasonic treatment in the same liquid.

Step 3 Water washing

The test pieces were then moved into deionized water, subjected to ultrasonic treatment for 3 minutes and then again subjected to ultrasonic treatment for 1 minute in new deionized water.

Step 4 HF treatment

Test pieces obtained in Step 3 were further immersed in 50% hydrofluoric acid at 40° C. for 5 minutes, washed with water and then subjected to the following plating steps (steps 5 to 10).

Step 5 Predipping

The test pieces after the pretreatment steps were immersed in 10% aqueous hydrochloric acid solution for 2 minutes.

Step 6 Catalyzing

After the predipping the test pieces were immersed in an aqueous solution containing 200 ml of 35% hydrochloric acid and 20 ml of a catalyst (PB-316 produced by EBARA-UDYLITE) in 1 liter of water for 5 minutes, and then water washed with deionized water for 1 minute.

Step 7 Accelerating

The resulting test pieces were immersed for 2 minutes in an aqueous solution containig 150 ml of PB-444, an accelerator produced by EBARA-UDYLITE in 1 liter of water, and then water washed with deionized water for 1 minute.

Step 8 Electroless plating

The resulting test pieces were immersed for 1 hour in a solution of each 100 ml of electroless copper plating liquids PB-502A and PB-502B produced by EBARA-UDYLITE in 1 liter of water to be electrolessly copper-plated to a thickness of about 1 micrometer, and then water washed with deionized water for 1 minute.

Step 9 Electroplating

The electrolessly copper-plated test pieces were immersed in 10% sulfuric acid for 30 seconds, immersed in an electric copper plating bath containing in 1 liter thereof 75 g of $CuSO_4.H_2O$, 180 g of sulfuric acid, 0.125 ml of 35% hydrochloric acid and 5 ml of Cu-Brite TH, a brightener produced by EBARA-UDYLITE, copper electroplated at a current density of $3A/dm^2$ for about 1 hour to a thick thickness of copper of about 35 micrometers, and then water washed with deionized water for 1 minute.

Step 10 Drying

The test pieces after the copper electroplating were dried at 90° C. for 12 hours.

The test pieces after the copper electroplating of Step 10 were measured for peel strengh according to JIS 6481 (measured by TSM-20 type produced by TOSOKU SEIMITSU KOGYO CO.) and for center line average roughness (Ra) by a surface roughness tester (Surfcom 554A type produced by TOKYO SEIMITSU CO.). Further an appearance test by visual observation was also carried out. These results were indicated in Table 1. Measurement result of surface roughness (surface roughness curve) was shown in FIG. 1.

Example 2

Procedures of Example 1 were repeated except that N,N-dimethylacetamide was used in place of N-methyl-2-pyrrolidone in the solvent treatment of Step 2 to obtain copper electroplated test pieces. Those test pieces were subjected to measurement of peel stregth and surface roughness and the appearance test by visual observation in the same manner as in Example 1. These results were indicated in Table 1.

Example 3

Procedures of Example 1 were repeated except that the HF treatment of Step 4 was omitted. The resulting copper electroplated test pieces were subjected to measurement of peel strength and surface roughness and the appearance test by visual observation in the same manner as in Example 1. These results were indicated in Table 1.

Example 4

Procedures of Exmaple 1 were repeated except that the solvent of Step 2 of Example 1 was changed for a mixed solvent of 50 weight % of N-methyl-2-pyrrolidone and 50 weight % of N,N-dimethylformamide. The resulting copper electroplated test pieces were subjected to measurement of peel strength and surface roughness and the appearance test by visual observation in the same manner as in Example 1. These results were indicated in Table 1.

Example 5

Procedures of Example 1 were repeated except that the solvent in Step 2 of Example 1 was changed for a mixed solvent of 80 weight % to N,N-dimethylacetamide and 20 weight % of N,N-dimethylformamide. The resulting copper electroplated test pieces were subjected to measurement of peel strength and surface roughness and appearance test by visual observation. These results were indicated in Table 1.

Example 6

Procedures of Exmple 1 were repeated except that TG-40 (containing 40 % of glass fiber) produced by TOHPREN company was used as a PPS resin. The resulting copper electroplated pieces were subjected to measurement of peel strength test and surface roughness and appearance test by visual observation in the same manner as in Example 1. These results were indicated in Table 1.

Comparative example 1 (Conventional process)

Figure 2:
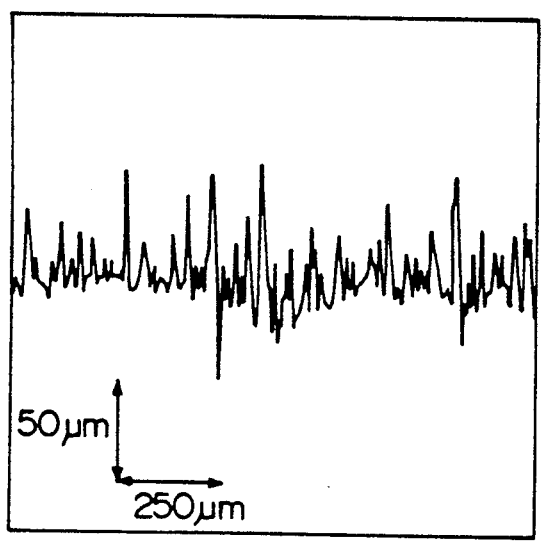
FIG. 2 shows a surface roughness curve of a copper electroplated test piece obtained in Comparative Example 1.

Procedures of Example 1 were repeated except that Steps 2 to 4 were omitted to obtain copper electroplated test pieces. These test pieces were subjected to measurement of peel strength and surface roughness and appearance test by visual observation in the same manner as in Example 1. These results were indicated in Table 1. Measurement result of surface roughness (surface roughness curve) by the surface roughness tester was shown in FIG. 2.

Comparative example 2

Procedures of Comparative example 1 were repeated except that TG-40 produced by TOHPREN Company was used as a PPS resin to obtain copper electroplated test pieces. These test pieces were subjected to measurement of peel strength and surface roughness and appearance test by visual observation in the same manner as in Example 1. These results were indicated in Table 1.

Example 7

PPS resin pellet (T-4P produced by TOHPREN Company) (54 weight parts), 6 weight parts of polyphenylene ether resin powder [poly (2,6-dimethyl-1,4-phenylene) ether produced by MITSUBISHI GAS CHEMICAL COMPANY, INC., intrinsic viscosity measured in chloroform at 25° C. 0.47 dl/g] and 40 weight parts of glass fiber (CS 03 MA 404 produced by ASAHI FIBER GLASS COMPANY) were uniformly mixed, and then subjected to melting and kneading at 300° to 320° C. using a biaxial extruder to obtain pellets.

The above pellets were injection molded in the same manner as in Example 1 to obtain test pieces. The test pieces were treated in the same manner as in Example 1 to obtain copper electroplated test pieces.

These test pieces were subjected to measurement of peel strength and surface roughness and appearance test by visual observation in the same manner as in Example 1. These results were indicated in Table 2.

Example 8

Procedures of Example 7 were repeated except that 42 weight parts of PPS resin pellets and 18 weight parts of polyphenylene ether resin powder were used to obtain copper electroplated test pieces. These test pieces were subjected to measurement of peel strength and surface roughness and appearance test by visual observation in the same manner as in Example 1. These results were indicated in Table 2.

TABLE 1

|  | kind of PPS | Kind of B treatment[1] (Solvent treatment) | C treatment (HF treatment) | Peel strength (kg/cm) | Average roughness [Ra] (μm) | Appearance[2] |
|---|---|---|---|---|---|---|
| Example 1 | R-4 | NMP | Done | 1.51 | 2.7 | ○ |
| Example 2 | R-4 | DMA | Done | 1.33 | 2.9 | ○ |
| Example 3 | R-4 | NMP | Not done | 1.26 | 2.6 | ○ |
| Example 4 | R-4 | NMP/DMF = 50/50 | Done | 1.48 | 2.8 | ○ |
| Example 5 | R-4 | DMA/DMF = 80/20 | Done | 1.35 | 3.0 | ○ |
| Example 6 | TG-40 | NMP | Done | 1.58 | 3.7 | ○ |
| Comparative example 1 | R-4 | not done | Not done | 1.47 | 9.7 | X |
| Comparative example 2 | TG-40 | not done | Not done | 1.53 | 12.0 | X |

[1]NMP: N-methyl-2-pyrrolidone
DMA: N,N-dimethylacetamide
DMF: N,N-dimethylformamide
[2]one having a smooth surface and being lustrous ○
one having a rough surface and being cloudy X As is apparent from Exmples 1 to 6 and Comparative examples 1 and 2, when the pretreatment process of the present invention is used, there can be obtained plated proucts having a large peel strength and having at the same time a surface smoothness markedly excellent compared to the surface smoothness of plated products by conventional processes, and the resulting plated products can sufficiently be applied to minute circuit patterns.

Examples 9 to 17

Procedures of Example 17 were repeated except that 6 weight parts of the resin pellet indicated in Table 2 (added resin) was used in place of 6 weight parts of the polyphenylene ether resin powder of Example 7 to obtain copper electroplated test pieces. These test pieces were subjected to measurement of peel strength and surface roughness and appearance test by visual visual observation in the same manner as in Example 1. These results were indicated in Table 2.

Maker's names and trade names of the resin pellets indicated in Table 2 are as follows.

| Example | Resin pellet | Maker name | Trade name |
|---|---|---|---|
| 9 | Polyethylene terephthalate | JAPAN UNIPET | UNIPET A |
| 10 | Polybutylene terephthalate | TORAY | PBT 1401 |
| 11 | Polyarylate | UNITIKA | U polymer U-100 |
| 12 | Polysulfone | NISSAN CHEMICAL | UDEL P-1700 |

| Example | Resin pellet | Maker name | Trade name |
| --- | --- | --- | --- |
| 13 | Polyethersulfone | SUMITOMO CHEMICAL | VICTREX 4100G |
| 14 | Polyetherimide | ENGINEERING PLASTICS | ULTEM 1000 |
| 15 | Polyamide | MITSUBISHI GAS CHEMICAL | RENY 6001 |
| 16 | Plycarbonate | MITSUBISHI GAS CHEMICAL | lupilon E-2000 |
| 17 | Liquid crystal polymer | POLYPLASTICS | VECTR-A950 |

Comparative example 3

Procedures of Example 7 were repeated except that the treating steps before plating 2 (solvent treatment to 4 (HF treatment) of Example 7 were omitted to obtain opper electroplated test pieces. These test pieces were subjected to measurement of peel strength and surface roughness and appearance test by visual observation in the same manner as in Example 1. These results were indicated in Table 2.

Comparative example 4

Procedures of Example 8 were repeated except that the treating steps before plating 2 (solvent treatment) to 4 (HF treatment) of Example 8 were omitted to obtain copper electroplated test pieces. These test pieces were subjected to measurement of peel strength and surface roughness and appearance test by visual observation in the same manner as in Example 1. These results were indicated in Table 2. It is apparent from Example 7 to 17 and Comparative examples 3 to 4 that the pretreating process of the present invention has excellent effects also on the molded article obtained from a resin composition comprising PPS, other resins and a glass reinforcing agent.

treating the resulting resin molded article by immersion in an organic polar solvent-containing liquid (B treatment), said liquid containing N-methylpyrrolidone and/or dimethylacetamide in an amount of at least 5 wt. % of the liquid, and further, if necessary, treating the resulting resin molded articles by immersion in an aqueous fluoride salt of hydrofluoric acid solution (C treatment).

2. The process of claim 1 wherein the polyphenylene sulfide resin contains the paraphenylene sulfide unit

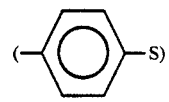

in an amount of at least 70 mole % of all the recurring units.

3. The process of claim 1 wherein the resin composition has a composition that
(a) total amount of the polyphenylene sulfide resin and the glass-reinforcing agent is at least 60% by weight of the whole resin composition, and
(b) the rate of the polyphenylene sulfide resin to the glass-reinforcing agent is in the range of 2:8 to 9:1 by weight.

4. The process of claim 1 wherein the mixed liquid in the A treatment contains per liter thereof 400 to 800 g of nitric acid and 50 to 300 g of the fluoride salt or hydrofluoric acid.

5. The process of claim 1 wherein the aqueous solution in the C treatment contains the fluoride salt and/or hydrofluoric acid in an amount of 5 to 60% by weight thereof.

TABLE 2

| | Added resin | Resin composition (A/PPS) | B treatment (Solvent treatment) | C treatment (HF treatment) | Peel strength (kg/cm) | Average roughness (μm) | Appearance |
| --- | --- | --- | --- | --- | --- | --- | --- |
| Example 7 | Polyphenylene ether | 1/9 | NMP | Done | 1.55 | 3.4 | ○ |
| 8 | Polyphenylene ether | 3/7 | NMP | Done | 1.73 | 3.3 | ○ |
| 9 | Polyethylene terephthalate | 1/9 | NMP | Done | 1.51 | 4.3 | ○ |
| 10 | Polybutylene terephthalate | 1/9 | NMP | Done | 1.53 | 4.3 | ○ |
| 11 | Polyarylate | 1/9 | NMP | Done | 1.55 | 2.6 | ○ |
| 12 | Polysulfone | 1/9 | NMP | Done | 1.52 | 4.8 | ○ |
| 13 | Polyethersulfone | 1/9 | NMP | Done | 1.55 | 5.3 | ○ |
| 14 | Polyetherimide | 1/9 | NMP | Done | 1.50 | 5.3 | ○ |
| 15 | Polyamide | 1/9 | NMP | Done | 1.50 | 3.2 | ○ |
| 16 | Polycarbonate | 1/9 | NMP | Done | 1.40 | 4.1 | ○ |
| 17 | Liquid crystal polymer | 1/9 | NMP | Done | 1.55 | 3.2 | ○ |
| Comparative example 3 | Polyphenylene ether | 1/9 | Not done | Not done | 1.64 | 11.8 | X |
| Comparative example 4 | Polyphenylene ether | 3/7 | Not done | Not done | 1.16 | 11.6 | X |

What is claimed is:

1. A process for metal plating a resin molded article molded from a resin composition containing as main components, a polyphenylene sulfide resin and a glass-reinforcing agent, which consists essentially of, before the metal plating,
(1) treating the resin molded articles by immersion in a mixed liquid of nitric acid and a fluoride salt or in a mixed liquid of nitric acid and hydrofluoric acid (A treatment), then

* * * * *